United States Patent
Yee et al.

(10) Patent No.: US 10,717,643 B2
(45) Date of Patent: Jul. 21, 2020

(54) BOARD MOUNTED MICROELECTROMECHANIC SYSTEM (MEMS) SENSORS FOR MOTOR DIAGNOSTICS AND ANALYTICS

(71) Applicant: Rockwell Automation Technologies, Inc., Mayfield Heights, OH (US)

(72) Inventors: Kristin N. Yee, Grafton, WI (US); Michael J. Melfi, Richfield, OH (US); Zhenhuan Yuan, Shanghai (CN); John A. Balcerak, Muskego, WI (US); Arun K. Guru, Brookfield, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 325 days.

(21) Appl. No.: 15/716,977

(22) Filed: Sep. 27, 2017

(65) Prior Publication Data
US 2019/0092621 A1    Mar. 28, 2019

(51) Int. Cl.
| | |
|---|---|
| *H05K 1/00* | (2006.01) |
| *B81B 3/00* | (2006.01) |
| *H02P 1/02* | (2006.01) |
| *G01D 11/24* | (2006.01) |
| *G01D 11/30* | (2006.01) |

(52) U.S. Cl.
CPC .......... *B81B 3/0075* (2013.01); *B81B 3/0048* (2013.01); *G01D 11/24* (2013.01); *G01D 11/245* (2013.01); *G01D 11/30* (2013.01); *H02P 1/02* (2013.01); *B81B 2201/0242* (2013.01)

(58) Field of Classification Search
USPC .......................................... 361/748
See application file for complete search history.

(56) References Cited

U.S. PATENT DOCUMENTS

| | | | |
|---|---|---|---|
| 7,486,182 B2 | 2/2009 | Hahn et al. | |
| 2004/0164728 A1 | 8/2004 | Rissing | |
| 2006/0084848 A1 | 4/2006 | Mitchnick | |
| 2012/0292469 A1* | 11/2012 | Miekley | G01D 11/30 248/221.11 |

FOREIGN PATENT DOCUMENTS

EP    2 674 764 A1    12/2013

OTHER PUBLICATIONS

Extended European Search Report completed Feb. 8, 2019 for Application No. EP 18 19 7161.5

* cited by examiner

*Primary Examiner* — Andargie M Aychillhum
(74) *Attorney, Agent, or Firm* — Fay Sharpe LLP

(57) ABSTRACT

A motor having a circuit board including at least two MEMS sensors. The circuit board is mounted within a housing of the motor using the same fasteners as an encoder of the motor. Mounting the MEMS sensors to the circuit board simplifies assembly of the motor and standardizes the positioning of the MEMS sensors within the housing, while the overall motor footprint is unaffected.

15 Claims, 5 Drawing Sheets

BOARD MOUNTED MICROELECTROMECHANIC SYSTEM (MEMS) SENSORS FOR MOTOR DIAGNOSTICS AND ANALYTICS

BACKGROUND INFORMATION

The subject matter disclosed herein relates to monitoring electric motors and, more particularly to a system and method for mounting sensors within an electric motor for monitoring one or more performance characteristics of the same.

Electric motors are employed in a variety of applications, such as material packaging, metal forming, paper handling, textiles, food processing and so forth. In a typical arrangement, a motor drive sends signals to the electric motor to control operation of the electric motor. Over time, operation of the electric motor results in wear and tear of various components (e.g., bearings, brakes, etc.). Routine maintenance and servicing can generally counteract the effects of wear and tear. However, identifying the root cause of maintenance issues (e.g., performing manual diagnostics) may be difficult and time-consuming, and preventative precautionary replacement or repair of components on a set schedule can be inefficient.

One approach to monitoring motor health has included the use of certain sensors for detecting various conditions indicative of wear and tear or other abnormal operation. Such sensors can include temperature sensors and/or MEMS sensors that are used to monitor for certain vibrations due to, for example, bearing wear and/or shaft imbalance/radial shaft load, brake wear, etc. In the past, one or more MEMS sensors have been provided as standalone components mounted independently to, for example, the motor housing, or within another housing associated with the motor. Such independently mounted MEMS sensors require extra manufacturing steps for mounting and/or wiring.

BRIEF DESCRIPTION

Aspects of the present disclosure are directed to MEMS sensors incorporated into a circuit board of a motor assembly and mounted in a particular configuration relative to an output shaft of the motor assembly. In an embodiment, the motor assembly includes an encoder, and the circuit board is mounted within a housing of the motor using the same fasteners or mounting structure as the encoder. By mounting the MEMS sensors (e.g., accelerometers or ultrasonic acoustic sensors) to the circuit board, manufacturing of the motor or mounting structure is simplified and the positioning of the MEMS sensors within the housing is standardized, while the overall motor assembly footprint is unaffected.

In accordance with one aspect, a motor assembly comprises a housing, an output shaft supported by the housing, and a circuit board at least partially surrounding opposite sides of the output shaft and having at least two MEMS sensors mounted thereto. In one embodiment, the circuit board has at least a partial annular shape and the at least two MEMS sensors are mounted at approximately diametrically opposed locations on the circuit board, and wherein the circuit board is mounted within the housing with the MEMS sensors and an axis of rotation of the output shaft being approximately collinear.

The circuit board can be secured to the housing at first and second locations, said first and second locations being collinear with the at least two MEMS sensors. First and second fasteners can be used to secure the circuit board to the housing at the respective first and second locations. The assembly can further include an encoder secured to the housing with the first and second fasteners. The circuit board can at least partially surround at least one of the output shaft or a shaft of the encoder. The circuit board and encoder can be mounted in a common compartment within the housing which compartment may be isolated from rotating components of the motor. The at least two MEMS sensors can be multi-axis MEMS sensors mounted to the circuit board with at least one axis of each MEMS sensor oriented in opposite directions.

In accordance with another aspect, a circuit board mountable concentrically with an axis of rotation of an associated shaft comprises a substrate and first and second MEMS sensors mounted on the substrate. The substrate has a semi-annular shape having an outer circumferential curved edge having a first radius of curvature, an inner circumferential curved edge having a second radius of curvature, and first and second edges extending between the outer circumferential curved edge and the inner circumferential curved edge. The outer circumferential curved edge and inner circumferential curved edge have a common point of curvature and the MEMS sensors are mounted to the substrate at diametrically opposed locations such that a centerline extending between the MEMS sensors extends through the point of curvature.

The first and second edges can delimit a slot for receiving an associated shaft such that the substrate can be positioned about the associated shaft with the axis of rotation of the associated shaft centered between and collinear with the first and second MEMS sensors. First and second mounting holes can be provided in the substrate, the mounting holes being in line with the first and second MEMS sensors. The first mounting hole can be located radially inwardly from the first MEMS sensor and the second mounting hole can be located radially inwardly from the second MEMS sensor. The mounting holes can be diametrically opposed from each other. A third mounting hole can be located equidistant from the first and second mounting holes, and may be used for grounding the circuit board. The ground path provided by the third hole can be used to shield analog/digital signals of the circuit board.

In accordance with another aspect, a method of assembling a motor assembly comprises providing a circuit board having a substrate and first and second MEMS sensors mounted on the substrate, wherein the substrate has a semi-annular shape having an outer circumferential curved edge having a first radius of curvature, an inner circumferential curved edge having a second radius of curvature, and first and second edges extending between the outer circumferential curved edge and the inner circumferential curved edge, wherein the outer circumferential curved edge and inner circumferential curved edge have a common point of curvature, and wherein the MEMS sensors are mounted to the substrate at diametrically opposed locations such that a centerline between the MEMS sensors extends through the point of curvature, positioning the circuit board in a compartment of a housing of the motor assembly such that the MEMS sensors are collinear with an axis of rotation of an output shaft of the motor, positioning an encoder in the compartment; and securing the circuit board and the encoder to the housing using at least one common fastener.

DETAILED DESCRIPTION

Figure 1:
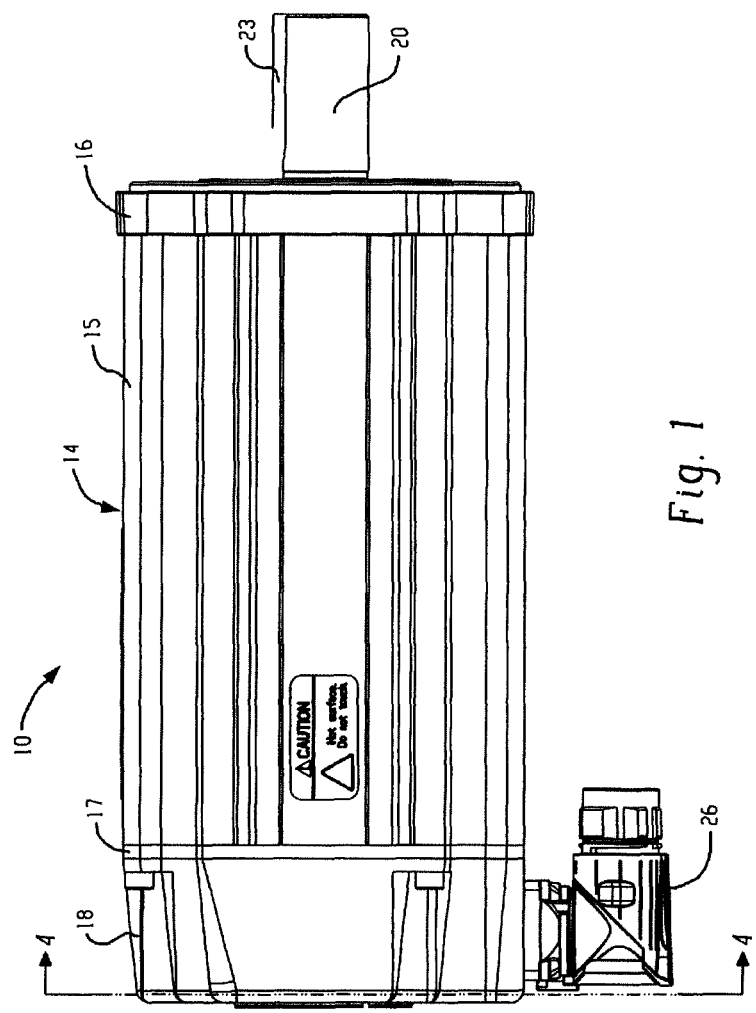
FIG. 1 is a side view of an exemplary motor in accordance with the present disclosure.
Figure 2:
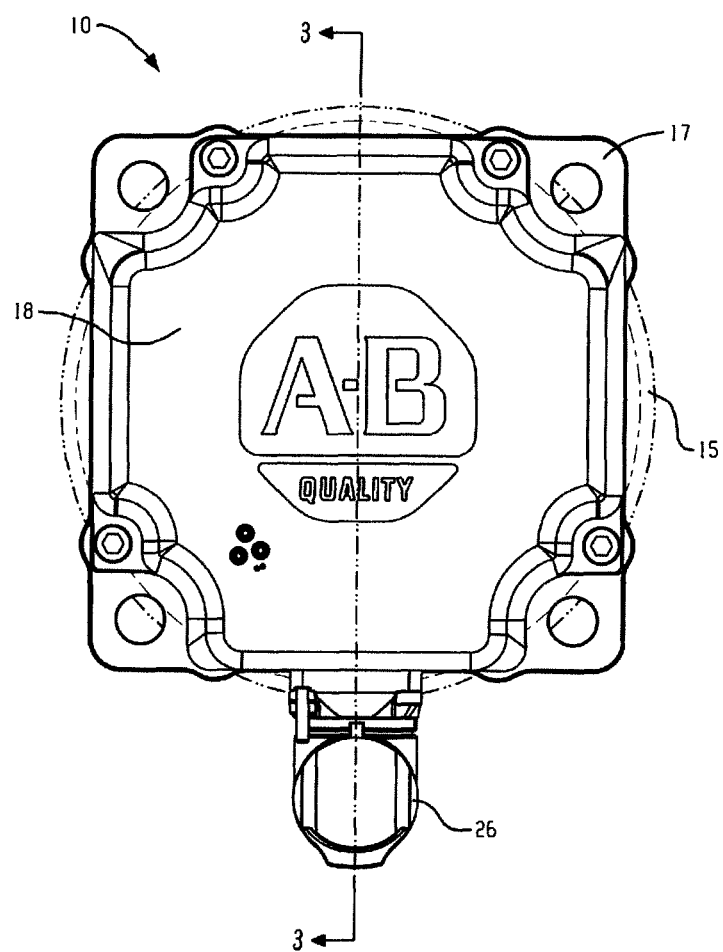
FIG. 2 is an end view of the exemplary motor.

With initial reference to FIGS. 1 and 2, an exemplary motor assembly is illustrated and identified generally by reference numeral 10. It will be appreciated that aspects of the present disclosure are applicable to a wide variety of electric motor configurations, as well as other applications where a rotating shaft is present (e.g., pumps, etc.). Accordingly, it should be understood that many of the features of the motor are exemplary in nature and intended to give context to certain aspects of the disclosure.

The exemplary motor assembly 10 generally includes a housing 14 for supporting and/or enclosing the various internal components of the motor assembly 10, as will be described below. The housing 14 includes a main tubular portion 15, a front bearing support/front plate 16 and rear bearing support 17, and an end cap 18. The end cap 18 can be fixed, or removable in the field depending on the particular design of the motor assembly 10. The end cap 18 can have additional connectors to receive signals from external sensors. In some embodiments, the end cap 18 can include fins to aid in dissipating heat. Together, these housing components form a sealed internal chamber (or multiple chambers) for housing, among other things, the rotating elements of the motor, related circuitry and a position feedback device. An output shaft 20 extends from the housing 14 for connection to an associated component to be driven by the motor 10. The output shaft 20 in the illustrated embodiment includes a keyway 22 for receiving a key 23 for rotationally coupling the output shaft 20 to the associated component. An electrical connector 26 provides a connection point for coupling the motor assembly 10 to a motor drive (not shown).

Figure 3:
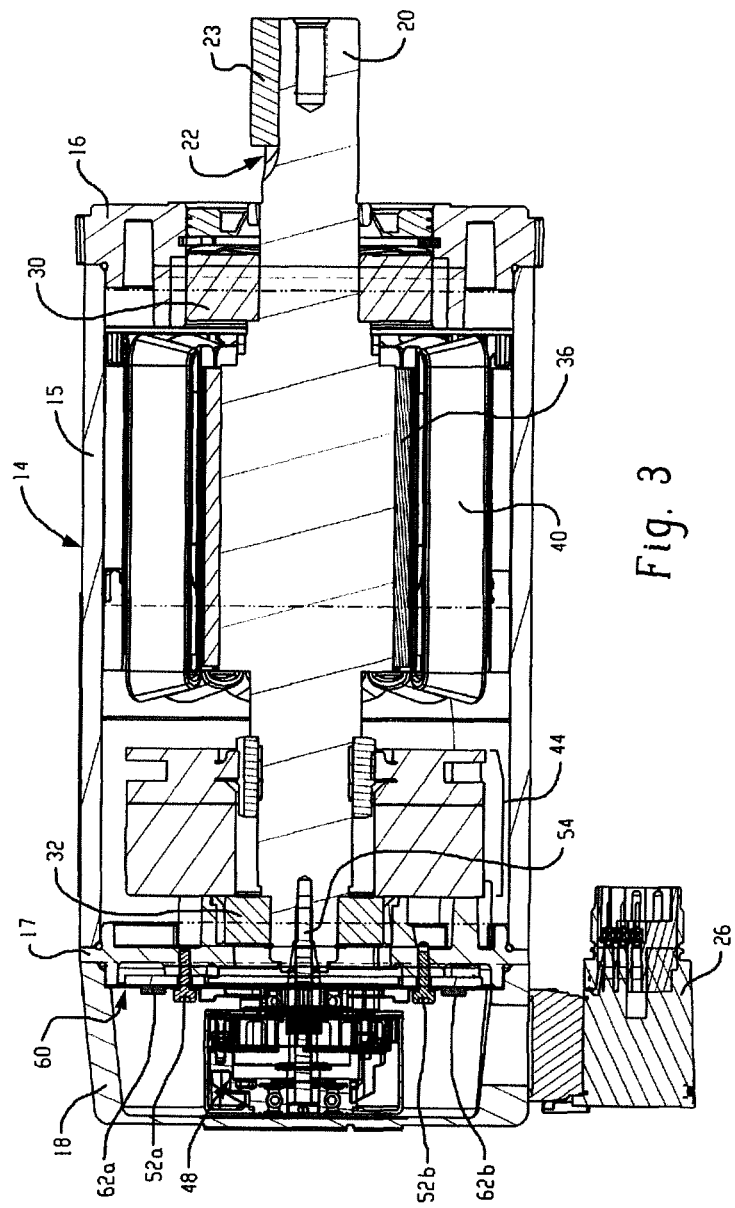
FIG. 3 is a cross-sectional view of the motor taken through line 3-3 in FIG. 2.
Figure 4:
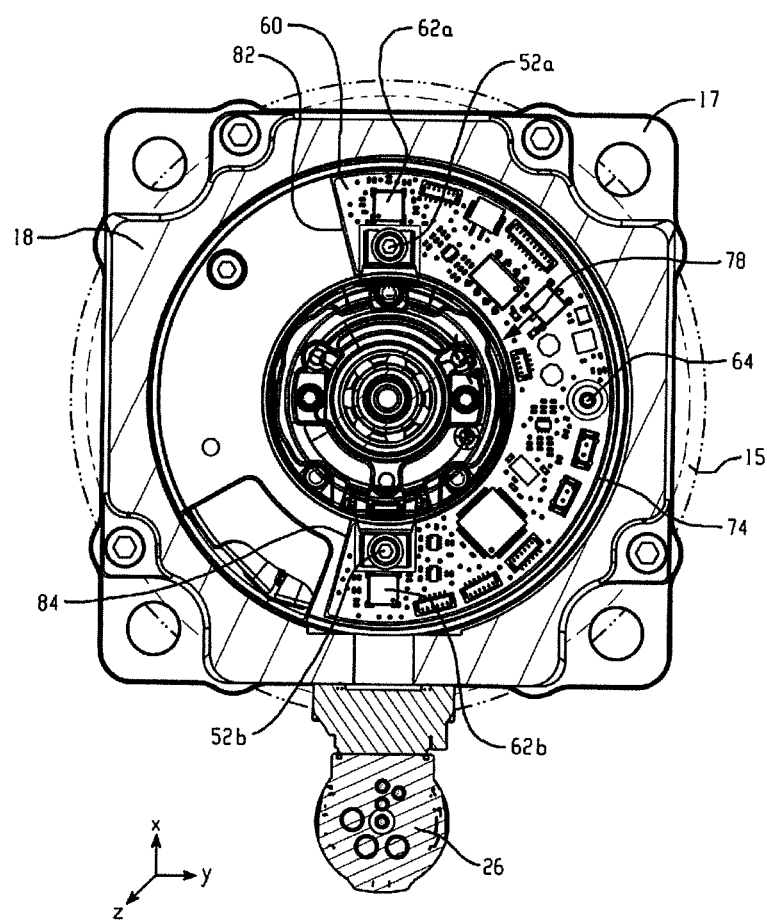
FIG. 4 is a cross-sectional view of the motor taken through line 4-4 in FIG. 1.

Turning to FIGS. 3 and 4, the internal components of the motor assembly 10 will be described. The output shaft 20 is supported for rotation by front and rear bearings 30 and 32 which are supported, respectively, by the front bearing support/front plate 16 and the rear bearing support 17. As is typical, a rotor 36 is fixed to the output shaft 20 for rotation therewith, while a stator 40 is fixed within the tubular main portion 15 of the housing 14. The illustrated exemplary motor assembly 10 further includes a brake assembly 44 for braking rotation of the output shaft 20.

A position feedback device, which in the illustrated embodiment is an encoder 48, is mounted to the rear bearing support 17 via bolts 52a and 52b. A shaft 54 of the encoder 48 is fixed to the output shaft 20 for rotation therewith. As will be appreciated, the encoder 48 provides feedback indicative of, among other things, the angular position of the output shaft 20.

In accordance with the present disclosure, interposed between the encoder 48 and the rear bearing support 17 is a circuit board 60. The circuit board 60 includes various electrical components for controlling and/or monitoring certain aspects of the motor 10. The circuit board 60 provides an interface between the encoder 48 and an associated motor drive.

Among other electronic devices supported by the circuit board 60 are first and second MEMS sensors 62a and 62b.

The MEMS sensors can include, for example, devices that capture acceleration data in at least 2 axes of motion. The exemplary MEMS sensors 62a and 62b are surface mounted to the circuit board 60, and are generally capable of measuring up to, for example, 2 kHz frequency of vibration. Other sensors can be used in certain applications for sensing higher frequencies up to, for example, 80 kHz (e.g., MEMS ultrasonic acoustic sensors).

The MEMS sensors 62a and 62b are mounted directly to the circuit board 60, which in turn is mounted to the rear bearing support 17 along with the encoder 48 using the same mounting bolts 52a and 52b. The MEMS sensors 62a and 62b are mounted at diametrically opposed locations on the circuit board 60, and arranged such that a centerline extending between the MEMS sensors 62a and 62b extends through the axis of rotation of the output shaft 20 (e.g., the MEMS sensors 62a and 62b and the axis of rotation of the output shaft 20 are collinear). It will further be appreciated that the bolts 52a and 52b are also in line with the MEMS sensors 62a and 62b and the axis of rotation of the shaft 20. The circuit board 60 is further secured to the rear bearing support 17 with a third bolt 64, which can help minimize vibration at the MEMS sensors 62a and 62b. The third point of attachment of the circuit board 60 helps to ensure that the resonant frequency of the circuit board is above the range where it would affect the MEM sensor reading.

The circuit board 60 can derive its power from a variety of sources. In some embodiments, the circuit board 60 can be powered by the same power source as the encoder 48 or other onboard component (e.g., a brake assembly). In other embodiments, the circuit board 60 can have a dedicated power source, or may harvest power (e.g., using vibration power harvesting or the like).

Figure 5:
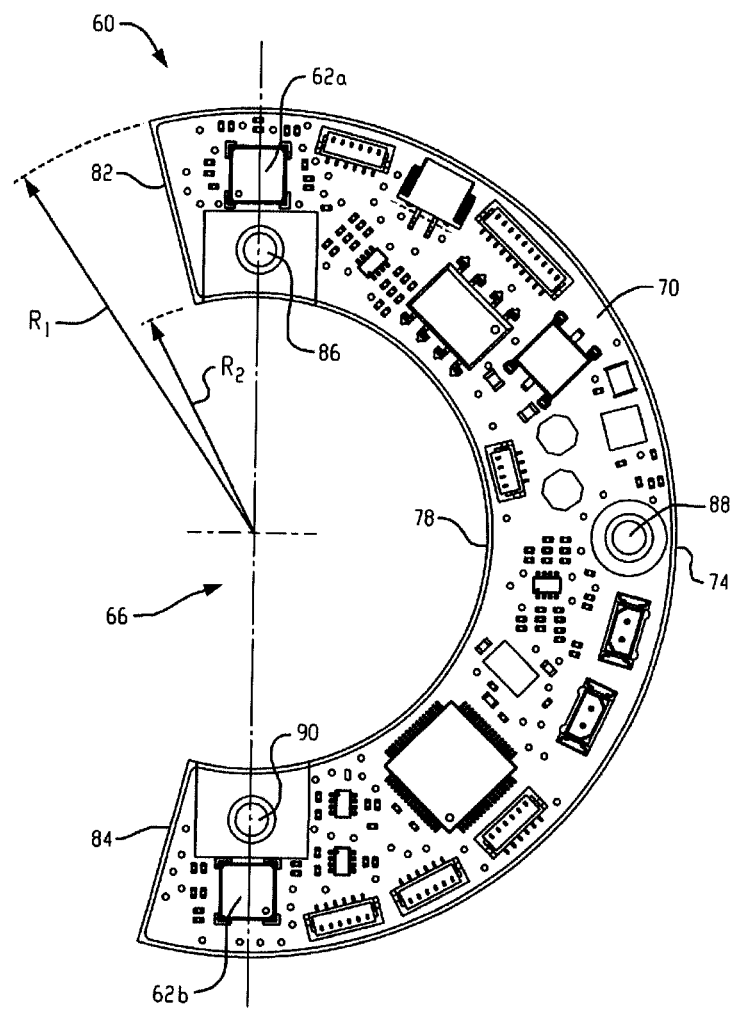
FIG. 5 illustrates an exemplary circuit board in accordance with the present disclosure.

As best seen in FIG. 5, the circuit board 60 in the illustrated embodiment is an annular shape (partial) with a slot 66 for allowing the circuit board to be positioned as described above. The circuit board generally comprises a substrate 70 on which the MEMS 62a and 62b and other electronic components are mounted. The substrate 70 is generally semicircular in shape and includes an outer circumferential edge 74, and inner circumferential edge 78, and end edges 82 and 84 extending therebetween. The end edges 82 and 84 delimit the slot 66 such that the circuit board 60 can be positioned around a shaft, if necessary, to align the MEMS sensors 62a and 62b with the rotational axis of the shaft. Mounting holes 86, 88 and 90 are provided for mounting the circuit board 60 as described above. Mounting hole 88, in some applications, is used to ground the circuit board 60 to help shield the analog and/or digital signals on the circuit board 60. As will be appreciated, any of the mounting holes can be used for grounding.

It will be appreciated that, in one embodiment, the MEMS sensors 62a and 62b can be 3-axis MEMS sensors and can be mounted to the circuit board 60 with one or more of the respective axes of each MEMS sensor oriented in opposite directions. For example, with reference to FIG. 4, one exemplary configuration of the MEMS sensors would be with a respective X-axis of each MEMS sensor oriented in opposite directions (e.g., one towards the top of the page and one towards the bottom of the page). By having the axes of the MEMS sensors oriented in opposite directions, certain feedback from each MEMS sensor can be canceled. Using dual multi-axis sensors provides one or more of the following features: facilitates providing two streams of vibration data, facilitates detecting rotational and/or radial unidirectional vibration, facilitates identifying mechanical resonance, facilitates detecting axial directional vibration (when using 3-axis sensors), facilitates detecting inclination of installation (when using 3-axis sensors).

Although not illustrated, one or more temperature sensors can also be mounted the circuit board 60. The data from the temperature sensors can be used to calibrate the MEMs sensors. It will be appreciated that temperature data obtained from other sources can also be used for MEMs sensor calibration. In addition, a visual indicator, such as an LED light or the like can be provided on the circuit board 60 to indicate power to the motor. A light pipe can be used to make the visual indicator visible on the end cap or other external surface.

Rigidly mounting the MEMS sensors in accordance with aspects of the present disclosure allows for vibration monitoring, motor health monitoring and/or bearing monitoring. That is, the MEMS sensors can detect abnormal vibrations during operation of the motor that can indicate one or more of the following conditions—excessive bearing wear, brake wear, brake backlash, gearbox failure, shaft imbalance/shaft radial loading, etc. In addition, unlike other approaches that include separately mounting a MEMS sensor to the motor housing and connecting the MEMS sensor to a main circuit board, the MEMS sensors of the present disclosure do not require separate mounting or separate connections since they are mounted directly to the circuit board 60. The arrangement of the present exemplary disclosure helps to improve noise immunity, reduce interconnections between components and simplifies assembly. For example, the circuit board 60 can not only provide an interface between the encoder 48 and an associated motor drive, it can also serve to aggregate the encoder data and MEMs acceleration data into one signal and pass such signal to the associated motor drive.

Mounting the MEMS sensor within the housing also places them in closer proximity to the mechanical structures that are anticipated to cause vibrations, thus locating them in better position to sense such vibrations or other movement than approaches where the MEMS sensors are external to the housing. Further, the MEMS sensors are shielded from the environment external to the housing, and the footprint of the motor assembly remains unchanged.

In the preceding specification, various embodiments have been described with reference to the accompanying drawings. It will, however, be evident that various modifications and changes may be made thereto, and additional embodiments may be implemented, without departing from the broader scope of the invention as set forth in the claims that follow. The specification and drawings are accordingly to be regarded in an illustrative rather than restrictive sense.

The following is claimed:

1. A motor assembly comprising: a housing; an output shaft supported by the housing; and a circuit board at least partially surrounding opposite sides of the output shaft and having at least two MEMS sensors mounted thereto, wherein the circuit board has at least a partial annular shape and the at least two MEMS sensors are mounted at approximately diametrically opposed locations on the circuit board, and wherein the circuit board is mounted within the housing with the at least two MEMS sensors and an axis of rotation of the output shaft being approximately collinear.

2. The motor assembly of claim 1, wherein the circuit board is secured to the housing at first and second locations, said first and second locations being approximately collinear with the at least two MEMS sensors.

3. The motor assembly of claim 2, wherein first and second fasteners are used to secure the circuit board to the housing at the respective first and second locations.

4. The motor assembly of claim 3, further comprising an encoder, wherein said encoder is secured to the housing with the first and second fasteners.

5. The motor assembly of claim 4, wherein the circuit board at least partially surrounds at least one of the output shaft or a shaft of the encoder.

6. The motor assembly of claim 4, wherein the circuit board and encoder are mounted in a common compartment within the housing.

7. The motor assembly of claim 2, further comprising a third mounting location, the third mounting location providing a ground path for grounding the circuit board.

8. The motor assembly of claim 1, wherein the at least two MEMS sensors are multi-axis MEMS sensors mounted to the circuit board with at least one axis oriented in opposite directions.

9. A circuit board mountable concentrically with an axis of rotation of an associated shaft, the circuit board comprising a substrate and first and second MEMS sensors mounted on the substrate, wherein the substrate has a semi-annular shape having an outer circumferential curved edge having a first radius of curvature, an inner circumferential curved edge having a second radius of curvature, and first and second edges extending between the outer circumferential curved edge and the inner circumferential curved edge, wherein the outer circumferential edge and inner circumferential edge have a common point of curvature, and wherein the MEMS sensors are mounted to the substrate at diametrically opposed locations such that a centerline between the MEMS sensors extends through the point of curvature.

10. The circuit board of claim 9, wherein the first and second edges delimit slot in the circuit board for receiving an associated shaft such that the substrate can be positioned about the associated shaft with the axis of rotation of the associated shaft centered between and collinear with the first and second MEMS sensors.

11. The circuit board of claim 9, further comprising first and second mounting holes, the mounting holes being in line with the first and second MEMS sensors.

12. The circuit board of claim 11, wherein the first mounting hole is located radially inwardly from the first MEMS sensor and the second mounting hole is located radially inwardly from the second MEMS sensor.

13. The circuit board of claim 12, wherein the mounting holes are diametrically opposed from each other.

14. The circuit board of claim 11, further comprising a third mounting hole located equidistant from the first and second mounting holes.

15. A method of assembling a motor comprising:
providing a circuit board having a substrate and first and second MEMS sensors mounted on the substrate, wherein the substrate has a semi-annular shape having an outer circumferential curved edge having a first radius of curvature, an inner circumferential curved edge having a second radius of curvature, and first and second edges extending between the outer circumferential curved edge and the inner circumferential curved edge, wherein the outer circumferential edge and inner circumferential edge have a common point of curvature, and wherein the MEMS sensors are mounted to the substrate at diametrically opposed locations such that a centerline between the MEMS sensors extends through the point of curvature, positioning the circuit board in a compartment of a housing of the motor such that the MEMS sensors are collinear with an axis of rotation of an output shaft of the motor, positioning an encoder in the compartment, and securing the circuit board and the encoder to the housing using at least one common fastener.

\* \* \* \* \*